United States Patent [19]

Wang et al.

[11] Patent Number: 5,369,311
[45] Date of Patent: Nov. 29, 1994

[54] CLOCK GENERATOR CONTROL CIRCUIT

[75] Inventors: Tan T. Wang, Penang, Malaysia;
Andrew M. Volk, Loomis, Calif.

[73] Assignee: Intel Corporation, Santa Clara, Calif.

[21] Appl. No.: 847,927

[22] Filed: Mar. 6, 1992

[51] Int. Cl.$^5$ .................. G11C 5/00; H03K 5/13;
H03K 19/007; H03K 21/38
[52] U.S. Cl. .................. 327/292; 377/107;
377/111; 377/114; 327/291; 327/178; 327/143;
327/546; 326/14
[58] Field of Search .................. 307/272.3, 269, 296.6,
307/296.1, 296.4, 296.5, 296.8, 442, 290;
328/63, 72; 377/107, 111, 114

[56] References Cited
U.S. PATENT DOCUMENTS

| | | | |
|---|---|---|---|
| 4,788,454 | 11/1988 | Tanagawa et al. | 307/272.3 |
| 4,975,593 | 12/1990 | Kurakazu et al. | 307/269 |
| 5,065,042 | 11/1991 | Thomsen et al. | 307/269 |
| 5,065,047 | 11/1991 | Igari et al. | 307/296.4 |
| 5,070,257 | 12/1991 | Farwell | 307/269 |
| 5,140,183 | 8/1992 | Takenaka | 307/272.3 |
| 5,159,217 | 10/1992 | Mortensen et al. | 307/269 |
| 5,173,617 | 12/1992 | Alsup et al. | 307/269 |
| 5,175,453 | 12/1992 | Chang et al. | 307/269 |

*Primary Examiner*—Timothy P. Callahan
*Assistant Examiner*—Trong Phan
*Attorney, Agent, or Firm*—Blakely, Sokoloff, Taylor & Zafman

[57] ABSTRACT

A controller for a clock generator. The controller of the present invention enables a clock signal to the internal clocking mechanism of a device. The controller of the present invention includes a detector and a timer. The detector has two input sense levels, such that it is capable of detecting a clock signal at two separate levels, the first level being larger than the second. Initially, the detector only detects when the clock signal is at a level greater than or equal to the larger of the levels. When this occurs, the timer begins counting. When the clock signal has been at or above the greater level for a predetermined time as determined by the timer, the detector enables the clock signal to go to the internal clocking mechanism. Thereafter, the detector only senses when the clock signal falls below the second level. Thus, the detector enables the clock signal to go to the internal clocking mechanism while the level of the clock signal is above the second level.

28 Claims, 4 Drawing Sheets

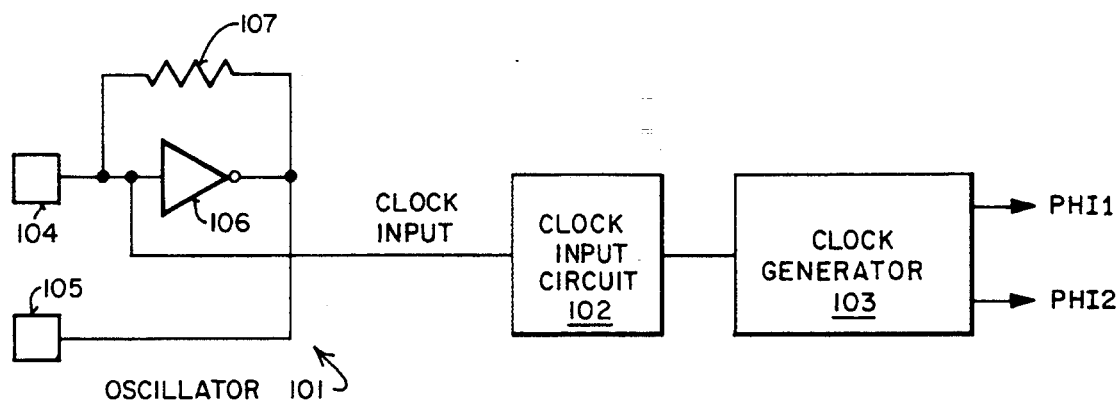
FIG_1
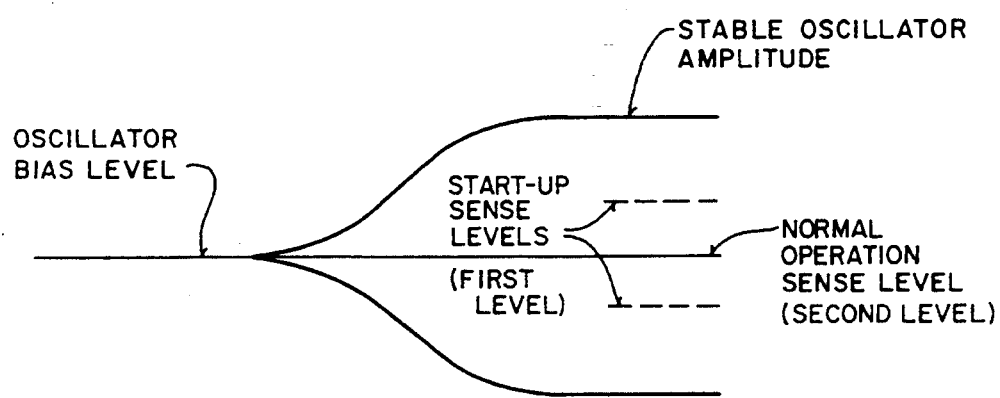
FIG_3

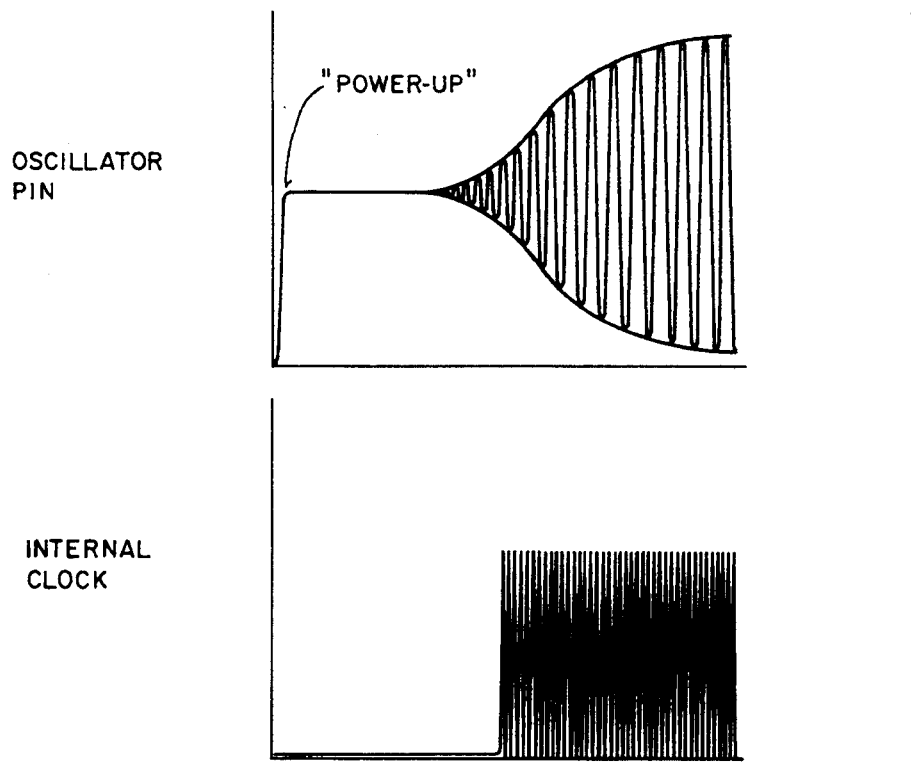
FIG_2A
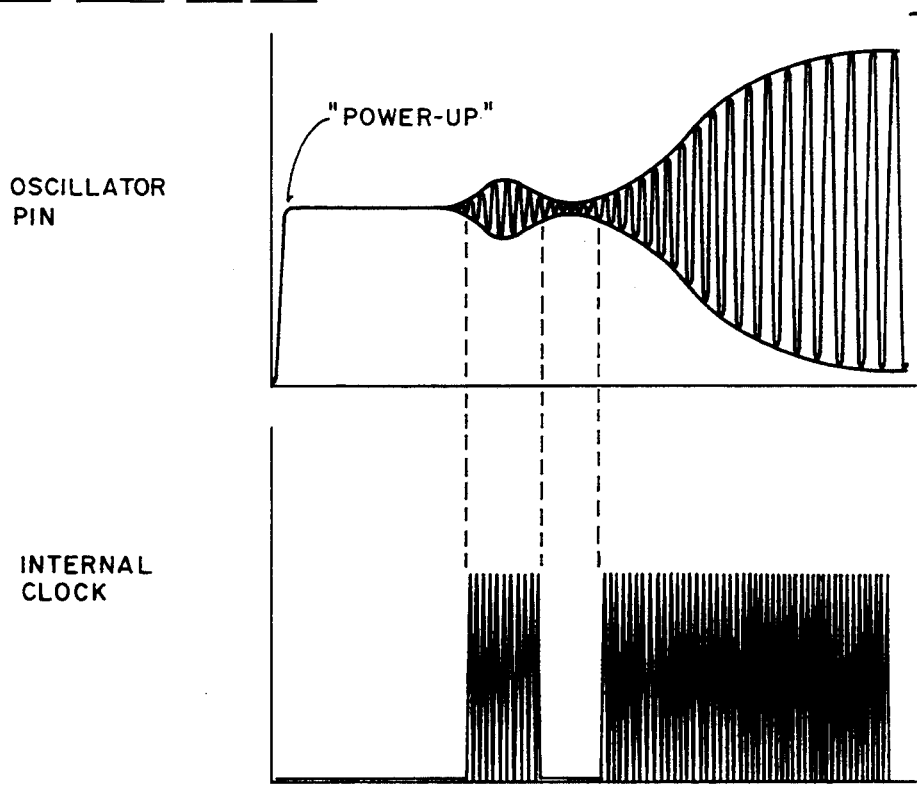
FIG_2B

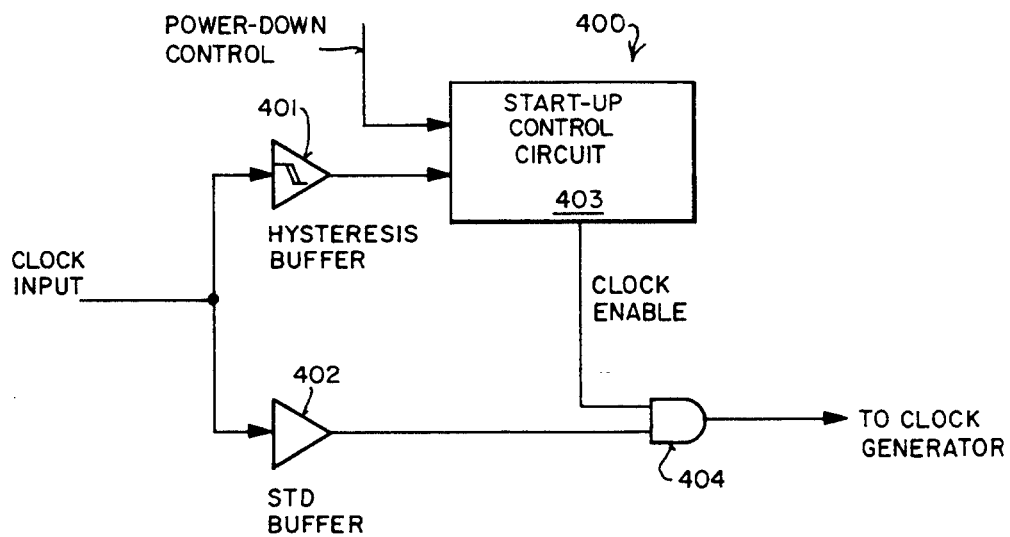
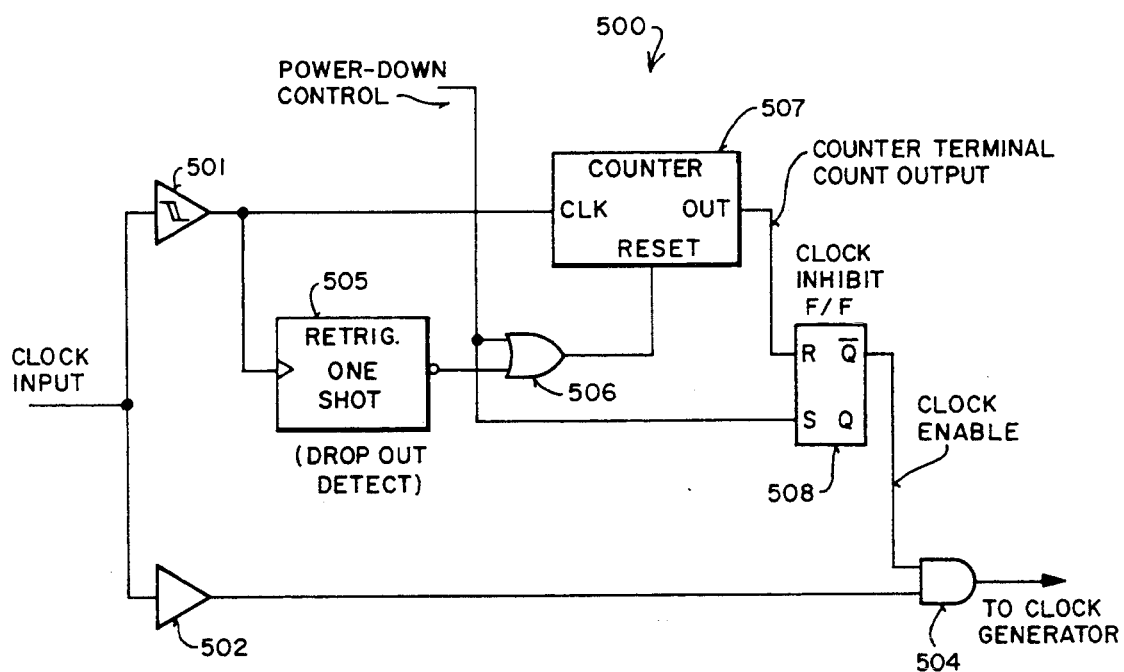

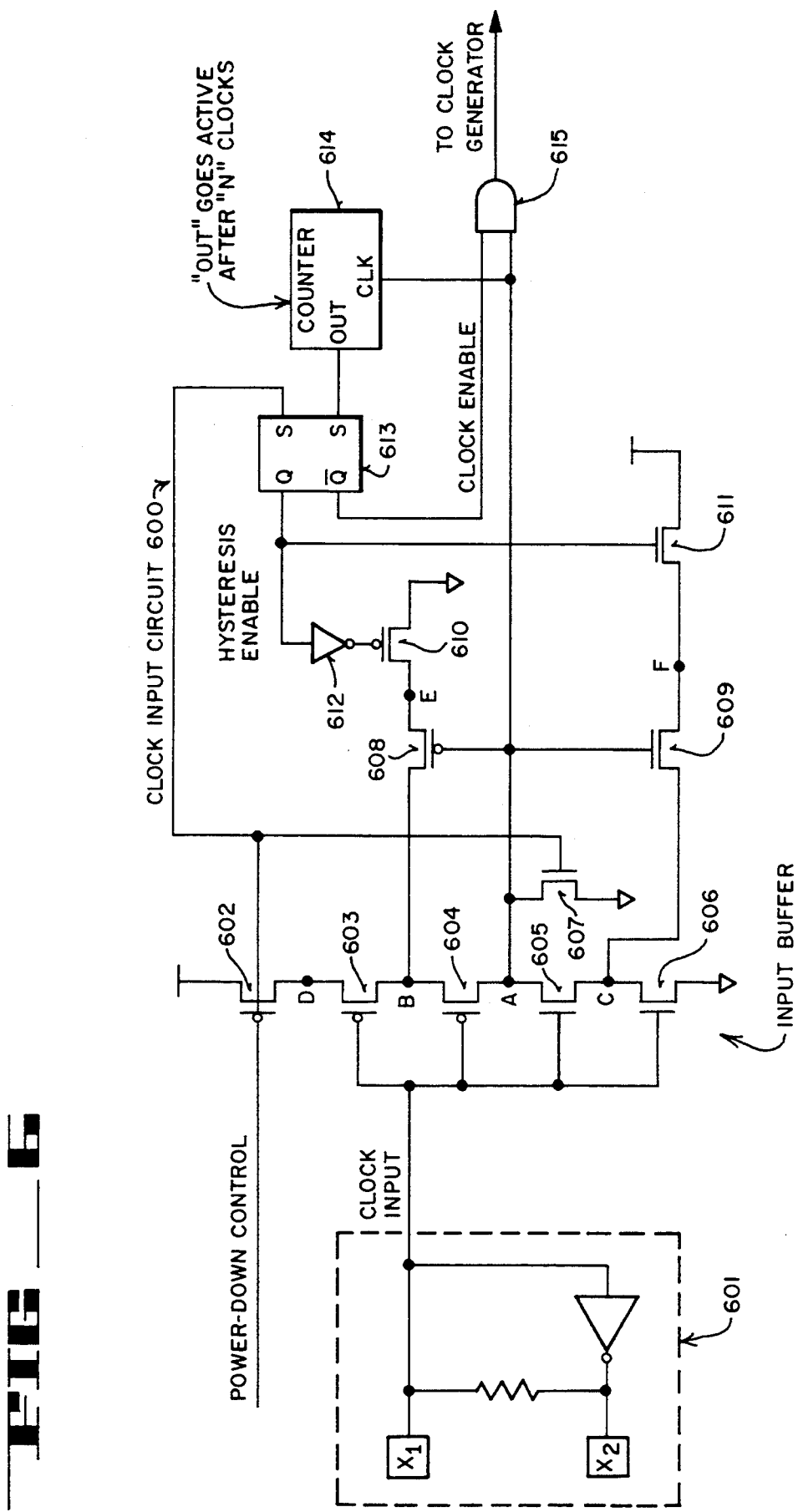

CLOCK GENERATOR CONTROL CIRCUIT

FIELD OF THE INVENTION

The present invention relates generally to the field of clock generators; particularly, the present invention relates to controlling the start-up of clock generators.

BACKGROUND OF THE INVENTION

The emergence of the laptop computer market has made it necessary for new PC products to be able to operate with very low power. To accommodate these low power requirements, some computer chips employ powerdown circuits. Powerdown circuits allow a chip to enter a state that draws little or no current. Powerdown usually occurs when a chip is currently not active. To become active again, a chip must be powered up. Special power down and power up problems exist for chips that have built-in crystal oscillators. Crystal oscillators have notoriously bad start-up characteristics. One of these characteristics is a slow turn on. That is, any recovery time from the time of power up to the time of stable oscillation is quite long. This recovery time is typically around 0.5 ms, but may be up to tens of milliseconds under worst case conditions. Another start-up characteristic is that the crystal oscillator is subject to "drop out" where the oscillations begin and then stop for a period of time before resuming. The length of the drop out can be many microseconds and occur numerous times during the recovery period. This drop out characteristic can cause problems for a circuit that is trying to restart its operation during this recovery time. Because these characteristics cause the oscillation to stop and restart, using crystal oscillators to drive devices requiring the oscillator to remain running once it begins may be difficult (e.g., devices that have dynamic states outside the powerdown condition).

Prior art approaches to clock generators either do not address this problem, modify the entire device design to be more immune to drop out or attempt to delay enabling the clock until the oscillator stabilizes. Clearly ignoring the problem can lead to a loss in dynamic states when drop out occurs. Immunization usually entails removing or designing out any dynamic nature in the device, thereby making the design entirely static. This amount of dynamic to static functional conversion of an existing device can be very large. Furthermore, it is difficult to guarantee, by testing, that all states that may follow the powerdown state are truly static. Of the three prior art approaches, the most popular is to delay enabling the clock until the oscillator has had time to stabilize. However, outlasting the worst case oscillator start-up is an expensive option since delays of 10 ms or more are required before a crystal oscillator that generates clock signals in the tens of Megahertz becomes stabilized. Furthermore, delaying enablement of the clock signal to the device prevents the device from operating until the maximum oscillator characteristics have been achieved, which is not well tolerated in all applications.

As will be seen, the present invention provides a method and a means for enabling the clock signal to a device when the oscillator attains a certain amplitude for a period of time. The present invention allows the oscillator to attain an amplitude which removes the possibility of drop out and, thus, enables the clock input to the device, thereby obtaining a clean start-up.

SUMMARY OF THE INVENTION

A controller for a clock generator is described. The controller of the present invention enables a clock signal to the internal clocking mechanism of a device. The controller of the present invention includes a detector and a timer. The detector senses the level of the clock signal. The detector of the present invention is capable of detecting the clock signal at two separate levels, the first level requiring a larger amplitude of oscillation than the second. Initially, the detector only detects when the clock signal is at an amplitude greater than or equal to the first level. When this occurs, the timer begins counting.

When the clock signal has been at or above the first level for a predetermined time as determined by the timer, the detector enables the clock signal to go to the internal clocking mechanism. Thereafter, the detector only senses the clock signal at the second level. Thus, the detector enables the clock signal to go to the internal clocking mechanism while the level of the clock signal is above the second level.

BRIEF DESCRIPTION OF DRAWINGS

The present invention will be understood more fully from the detailed description given below and from the accompanying drawings of the preferred embodiment of the invention, which, however, should not be taken to limit the invention to the specific embodiments, but are for explanation and understanding only.

FIG. 1 is a block diagram of an oscillator/clock input circuitry of the present invention.

FIGS. 2A and 2B illustrate the normal oscillator start-up and oscillator drop out.

FIG. 3 illustrates the clock input circuit sense levels of the present invention.

FIG. 4 is a general circuit schematic depicting an embodiment of the clock input circuitry of the present invention.

FIG. 5 is a circuit schematic of the clock input circuitry depicting one embodiment of the start-up control circuitry of the present invention.

FIG. 6 is a circuit schematic depicting another embodiment of the clock circuitry of the present invention.

DETAILED DESCRIPTION OF THE INVENTION

A circuit for controlling the start-up of a clock generator is described. In the following description, numerous specific details are set forth, such as specific device types, signal names, lengths of time, etc., in order to provide a thorough understanding of the preferred embodiment of the present invention. It will be understood to one skilled in the art that the present invention may be practiced without these specific details. Also, well-known circuits have been shown in block diagram form, rather than in detail, in order to avoid unnecessarily obscuring the present invention.

FIG. 1 is a block diagram of the oscillator/clock circuitry of the present invention. Referring to FIG. 1, oscillator 101 generates a clock signal which is input to clock input circuit 102. A clock signal is output from clock input circuit 102 and is coupled to the input of clock generator 103. In response to the clock signal from clock input circuit 102, clock generator 103 generates the PHI1 and PHI2 phase clock signals. Oscillator 101 is any circuit that drives the crystal and sustains oscillation, thereby generating a clock signal. In the currently preferred embodiment, oscillator 101 comprises input 104, output 105, inverter 106 and resistor 107, as shown in FIG. 1. The output of inverter 106 is coupled to the oscillator input through resistor 107.

The clock input node is where the oscillations generated by oscillator 101 are detected and from which the oscillations are generated. In the currently preferred embodiment, the clock input circuit 102 detects the oscillators on the clock input node and generates metal-oxide semiconductor (MOS) level versions of the oscillations. It should be noted that the clock input circuitry could be coupled to the oscillator output. These internally generated MOS level versions drive clock generator 103 (which is internal to the device) which, in response, provides one or more main clocks (i.e., phases PHI1 and PHI2) to the chip.

The normal start-up and drop out of oscillator 101 is shown in FIGS. 2A and 2B respectively. Referring to FIG. 2A, the clock signal at the clock input node (i.e., the oscillator pin) is shown. Typically, the oscillation is a rail to rail, roughly sinusoidal signal. When starting from the powerdown state, the oscillation builds from a low energy level to an exponential envelope until it approaches the rail. The envelope usually requires a few hundred microseconds to build to approximately half the supply voltage, but may require many milliseconds. The envelope builds around a point that is equal to the DC bias point of the oscillator (e.g., as established by the resistor tying the input to the output). FIG. 2A also shows the internal clock signal generated by the clock input circuitry of the present invention in response to the oscillations received at the clock input node. As shown, the clock input circuitry produces a MOS level (i.e., digital) version of the clock signal in response to the exponentially increasing envelope generated by the oscillator. It should be noted that as soon as the oscillations begin to build around the DC bias point, the internal clock circuitry of the clock input circuitry produces a MOS level clock signal.

FIG. 2B depicts the oscillator drop out for a clock generator circuit which does not have any drop out protection. The drop out portion of the envelope of the oscillation is shown as the "necked" section. As the envelope builds, any transients affecting the oscillator can cause a drop out which, in turn, cause the oscillator envelope to neck down. As the energy level in the oscillator grows, it is better able to withstand the transients which cause the drop out. After the effect of the transients have been overcome, the oscillation envelope begins exponentially increasing again. The effect of the drop out (due to the transient) on the internal clock is also shown in FIG. 2B. At the point of the drop out, the internal clock goes from a clock signal switching between the MOS logic levels to a steady level. Once the oscillation envelope begins again, the internal clock (i.e., the internal MOS version) goes back to switching between the MOS logic levels.

The drop out of the internal clock could be very damaging to dynamic circuitry (i.e., circuitry which requires clocking to retain its state) which has its clock supplied by the oscillator. The lack of a clock during a drop out could cause the dynamic circuitry to lose its state. However, the chances of a drop out occurring diminish with time. The reason for the possibility of drop outs lowering as time continues is due to the inherent characteristics of crystal oscillator operations. When an oscillator is started up, it has a very low energy level. At this very low energy level, the oscillator is still very susceptible to transients. As the output of the oscillator builds exponentially, the energy in the crystal grows, making the oscillator less susceptible to transients. The growth of energy continues until the crystal stabilizes, coinciding with the stabilization in the oscillation envelope.

The present invention is aimed at avoiding the effect of the drop out in the oscillations of the clock input, so that the clock signal enabled to the clock generator of a device (i.e., chip) is clean. The clock input circuitry obtains the clean start-up by detecting the clock signal from the oscillator at two separate and distinct sense levels. One of the sense levels of the clock input circuitry requires that the clock signal build its amplitude to a stable level in order to be detected. The second sense level is one which is sensitive to the clock signal of the oscillator. The difference between the magnitude of the two sense levels is wide, such that the oscillator must build to the more stable level (i.e., the first higher sense level), and then after doing so, the oscillator is detected at the narrower level (i.e., the second sense level) to start normal operation.

The two input sense levels of the clock input circuit are shown in FIG. 3. Referring to FIG. 3, the first input sense level is shown as "first level" depicted by dotted lines (start-up sense levels), while the second is marked "second level." The second of the sense levels is set so that the input circuit switches at the bias level of the oscillator or close to the oscillator bias level. Setting the second level to the bias point gives the greatest sensitivity to oscillator amplitude and also increases resistance to drop out. The oscillator bias level is the sense level for normal operation. The first level is a pair of levels at which the input circuit switches at points well above and below the bias level, but well within the worst case steady state amplitude of the oscillator. It should be noted that the amplitude this first set of levels is between the oscillator bias level and the amplitude of the stable oscillator. In the currently preferred embodiment, the first set of levels is chosen to be approximately halfway between the bias level of the oscillator and the steady state amplitude of the oscillator once stabilized. Given a supply voltage of 5 volts, this level ensures that the oscillator is running at a volt or more. This varies, of course, depending on the supply, temperature, etc. The level is also chosen to ensure that the input circuitry receives enough overdrive to turn on quickly. Choosing the second sense level at the oscillator bias point allows the first set of sense levels to have the greatest difference between it and the second sense level and the best resistance to drop out. In the currently preferred embodiment, the second set of sense levels are set to switch in a manner like a Schmitt trigger, such that the higher of the sense levels is sensitive to the rising edges and lower level is sensitive to the falling edges. Several circuits are known which have this characteristic, such as the input buffer shown in FIG. 6 (discussed later).

The operation of the clock input circuitry begins with the detection of the start-up at the oscillator. For instance, in the currently preferred embodiment, this occurs when the part is coming out of a powerdown mode. At this time, the first, wide spaced sense level set is selected. That is, the clock input circuitry detects the clock signal at the first set of sense levels. While this set is being detected, the output of the clock input circuit, or the clock generator, is held inactive. Once the oscillations reach the first spaced-apart sense levels, the clock input circuitry waits for a certain number of oscillations to generate in order to ensure that reasonably stable operation occurs and to avoid false triggers. When the requisite number of oscillations occurs, the clock input sense level is switched to the second sense level. As the oscillator is now at a much higher amplitude, the clock input is now driven with a healthy signal. Since the oscillations are at this level, drop out is unlikely, especially drop out below the second sense level. The output of the input circuit is now enabled, such that the clock signal is enabled and normal operation begins. Thus, the present invention reduces the risk of interrupted clocks and starts the clock signal as soon as possible, consistent with reliable operation.

FIG. 4 depicts one embodiment of the clock input circuit of the present invention. Referring to FIG. 4, the clock input circuit comprises a hysteresis input buffer 401, a standard buffer 402, a start-up and control circuit 403 and an AND gate 404. The clock input from the oscillator is input into both hysteresis buffer 401 and standard buffer 402. The output of buffer 402 is input into one of the inputs of AND gate 404. The output of the hysteresis buffer is input into the start-up control circuit 403, along with the power down control signal. Start-up control circuit 403 generates the clock enable signal which is the other input of AND gate 404. The output of AND gate 404 goes to the clock generator.

When the oscillator starts up, the clock input is buffered to AND gate 404 via buffer 402. Initially, the clock enable signal from start-up control circuit 403 is low (i.e., a logical 0). Therefore, AND gate 404 does not produce a clock signal output to the clock generator.

Hysteresis buffer 401 also receives the clock signal from the clock input upon start-up of the oscillator. Hysteresis buffer 401 is a clock level sensing circuit. Initially, hysteresis buffer does not generate an output. Once the amplitude of the clock signal reaches a certain level, hysteresis buffer 401 generates an output. This level corresponds to the level of the second sense level described above.

The output from hysteresis buffer 401 is input into start-up control circuit 403. If the clock input circuit is not in powerdown, as indicated by the power down control signal input into start-up control circuit 403, and after a predetermined number of outputs from hysteresis buffer 401, start-up control circuit 403 generates a clock enable signal to AND gate 404 (i.e., a logical 1) which enables the clock signal from buffer 402 to go to the clock generator. Thereafter, any variation in the amplitude of the clock signal does not affect the enabling of the clock signal to the clock generator. Thus, the clock input circuit of FIG. 4 acts as though its sense level switches to a point below which the amplitude of the clock signal does not reach.

FIG. 5 depicts a block diagram of the clock input circuit of FIG. 4 including a detailed diagram of one embodiment of the start-up control circuit. As in FIG. 4 above, the clock input circuit 500 has a hysteresis buffer 501, a standard buffer 502 and an AND gate 504, wherein each is configured to operate in the same manner as their counterpart in FIG. 4. The output of hysteresis buffer 501 is input into the retriggerable one-shot 505 and the clock input CLK of counter 507. The output of retriggerable one-shot 505 is input into one of the inputs to OR gate 506. The other input of OR gate 506 is coupled to the power down control signal. The output of OR gate 506 is coupled to the reset input of counter 507. The output of counter 507 is input into the reset input R of R/S flip-flop 508. The set input S of flip-flop 508 is coupled to the power down control signal. The $\bar{Q}$ output of flip-flop 508 is coupled as the clock enable-signal to one of the inputs of AND gate 504.

As discussed in conjunction with FIG. 4 above, hysteresis buffer 501 is a level clock sensing circuit which generates an output only when the amplitude of the clock signal reaches a certain level. Upon generation of an output by hysteresis buffer 501, counter 507 initiates a count. Counter 507 counts the number of clock signals it receives on its CLK input from hysteresis buffer 501. After a predetermined number of clock pulses above the sense level of hysteresis buffer 501, counter 507 generates an output resetting R/S flip-flop 508. In the currently preferred embodiment, the predetermined number of clock pulses is 1000 counts. Resetting flip-flop 508 causes its $\bar{Q}$ output to go high, which enables AND gate 504 to output the clock signal to the clock generator from the clock input via buffer 502. Thus, counter 507 and R/S flip-flop 508 are used to detect the proper number of oscillations above the sense point of hysteresis buffer 501 and, thereafter, enable the regular clock path.

The predetermined length of time counter 507 counts is long enough to pass the worst case start-up with the fastest clock. The count of counter 507 is reset by the power down control and retriggerable one-shot 505 via OR gate 506. Retriggerable one-shot 505 acts as a drop out detector, such that it detects if the clock signal (i.e., the oscillations) continues without significant interruption during the time that counter 507 is counting before flip-flop 508 is reset. If one-shot 505 times out, indicating that there are no clocks to trigger it, then a logical one is output to OR gate 506, causing counter 507 to reset. The time-out period for one-shot 505 is set such that any legitimate slow clocks are bypassed and do not cause one-shot 505 to time-out. In the currently preferred embodiment, one-shot 505 generates an output to OR gate 506 if there are no clocks for one microsecond.

As stated earlier, the power down control signal also resets counter 507. In the currently preferred embodiment, if the power down control signal goes high, indicating that the device is going into power down mode, OR gate 506 outputs a signal that resets counter 507. This resetting of counter 507 causes it to halt generating an output on its OUT output. Moreover, the power down control signal is also coupled to the S input of R/S flip-flop 508. With the power down control signal being high (i.e., a logical 1), the $\bar{Q}$ output of R/S flip-flop 508 is set to low (i.e., a logical 0). The setting of $\bar{Q}$ output low disables the clock signal from continuing through AND gate 504 by placing a low signal on one of its inputs.

FIG. 6 displays one complementary MOS (CMOS) embodiment of the clock input circuit of the present invention. In this embodiment, the two input buffers depicted in FIG. 5 as buffers 501 and 502 are combined into a single buffer. Referring to FIG. 6, oscillator 601 generates a clock signal which is output to the clock input of the clock input circuits. The clock input is coupled to the gates of p-channel MOS (PMOS) devices 603 and 604 and the gates of n-channel MOS (NMOS) devices 605 and 606. MOS devices 603–606 are coupled serially between the drain of PMOS device 602 and ground. The source and drain NMOS device 606 are coupled to ground and the source of NMOS device 605 (at node C) respectively. The source and drain of PMOS device 603 are coupled to the drain of PMOS device 602 and the source of PMOS device 605 (at node B) respectively. The drains of both PMOS device 604 and NMOS device 605 are coupled at node A. Node A is the output for the clock signal and is coupled to the drain of NMOS device 607, the gates of PMOS device 608 and NMOS device 609, the clock input to counter 614 and one input of AND gate 615. Nodes B and C are coupled to the drains of NMOS devices 608 and 609 respectively. The source and gate of PMOS device 602 are coupled to the supply potential and the power down control signal respectively.

Besides being coupled to the gate of PMOS device 602, the power down control signal is also coupled to the gate of NMOS device 607, the reset input of counter 614 and the S input of R/S (Set/Reset) flip-flop 613. The output of counter 614 is coupled to the R input of flip-flop 613. The Q output of flip-flop 613 is coupled to the input of inverter 612 and the gate of NMOS device 611. The source and drain of NMOS device 611 are coupled to the supply potential and the source of NMOS device 609. The output of inverter 612 is coupled to the gate of PMOS device 610. The source and drain of PMOS device 610 are coupled to ground and the source of PMOS device 608 respectively. The $\overline{Q}$ output of flip-flop 613 is coupled to the other input of AND gate 615. The output of AND gate 615 is output to the clock generator.

The clock input circuit 600 of FIG. 6 comprises an input buffer consisting of devices 603–606, 608 and 609. In the standard configuration, the drains of devices 603 and 609 (nodes D and F respectively) are coupled to the positive supply (e.g., $V_{cc}$) and the drain of device 608 (node E) is grounded. Thus, clock input circuit 600 is a classic Schmitt Trigger having feedback devices 608 and 609. These feedback devices 608 and 609 can be disabled by devices 610 and 611 respectively. Devices 610 and 611 are controlled by the hysteresis enable signal. The hysteresis of the clock input circuit is set by feedback devices 608 and 609 in conjunction with PMOS device 603 and NMOS device 606 respectively. In the currently preferred embodiment, once the feedback devices 608 and 609 have been disabled, the switch level of clock input circuit is set equal to the bias level of the oscillator for maximum sensitivity during normal operation.

During powerdown, power down control signal is high (i.e., logical 1), causing NMOS device 607 to turn on and ground the clock output at node A, and device 602 is turned off by the power down control signal, preventing any current flow in the input buffer. The power down control signal being high also resets counter 614 and set flip-flop 613. The setting of flip-flop 613 sets the hysteresis enable.

Upon powering up the device, the power down control signal goes low (i.e., logical 0), thereby turning off NMOS device 607 and turning on PMOS device 602, such that PMOS device 602 sources current to PMOS device 603. Also upon powering up, the hysteresis enable being high causes NMOS device 611 to turn on and source current to NMOS device 609. The hysteresis enable being high also causes the output of inverter 612 to be low (i.e., a logical 0), causing PMOS device 610 to turn on and ground the source of PMOS device 608. When PMOS device 610 and NMOS device 611 are on, PMOS devices 603, 604 and 608 in conjunction with NMOS devices 605, 606 and 609 produce a hysteresis, such that a clock signal is not generated at node A until the amplitude (e.g., the envelope) of the clock signal is at least at the first set of levels. Thus, the clock input circuit has a large hysteresis built into it, so that it requires that the clock at the clock input node to attain a certain level before tripping the hysteresis.

As the clock trips the hysteresis, counter 614 begins counting. After a predetermined number of oscillations above the first sense level are counted, the output of counter 614 goes active and resets flip-flop 613, clearing the hysteresis enable. This embodiment has a shorter counter. The plan is 1000 counts for the circuit in FIG. 5. Upon resetting the hysteresis enable, the clock enable input into AND gate 615 is placed high, such that the clock signal is enabled to the clock generator. Moreover, clearing the hysteresis enable, turns off devices 610 and 611, thereby disabling the feedback devices 608 and 609 respectively. Disabling devices 608 and 609 eliminates the hysteresis effect of the clock input circuit, such that PMOS devices 603 and 604 and NMOS devices 605 and 606 act as an ordinary inverter and sense at the second input sense level. Thus, clearing the hysteresis enable lowers the input sense level. At this point, in the currently preferred embodiment, the input sense level is switched to the oscillator bias point.

Various modifications to the clock input circuitry are possible. For instance, the number of clock pulses counted by counter 614 before switching sense levels can be changed. Furthermore, the counter 614 can be configured to reset any time the clock falls below the first set of input sense levels. Moreover, counter 614 can be configured to clock only if both sense levels are alternately exceeded (a better indication of a robust oscillation). Many simplifications are possible as well. For instance, the first set of sense levels can merely be moved away from the oscillators bias level, requiring it to build to that level before the clock input switches. This is a simpler implementation, but is not as reliable.

In sum, the present invention allows the start-up of the clock generator to be controlled. The present invention senses the amplitude of the clock signal and uses the "strength" of the clock signal as an indicator of when to enable the clock signal into the device safely. Furthermore, the present invention guards against local drops in the amplitude of the clock signal by changing the sensitivity or sense level for the clock signal. In this manner, the present invention guarantees that clean clocks are delivered to the core logic of a chip.

Whereas many alterations and modifications of the present invention will no doubt become apparent to a person of ordinary skill in the art after having read the foregoing description, it is understood that the particular embodiments shown and described by illustration are in no way intended to be limiting. Therefore, reference to the details of the preferred embodiments are not intended to limit the scope of the claims which themselves recite only those features regarded as essential to the invention.

Thus, a circuit for controlling the start-up of a clock generator has been described.

We claim:

1. A clock detection circuit for supplying a device clock signal to an on-chip clocking mechanism for clocking an integrated circuit device in response to an oscillator clock signal from an oscillator, wherein said oscillator clock signal has an envelope with a magnitude that varies over a range of magnitudes as the oscillator stabilizes from an initial magnitude to a final magnitude, said circuit comprising:

detecting means for sensing said oscillator clock signal to produce a detected oscillation signal, said detecting means capable of detecting said oscillator clock signal at a plurality of magnitudes, wherein said detecting means detects said oscillator clock signal at a first magnitude and a second magnitude, wherein said first magnitude and said second magnitude are within the range of magnitudes and said first magnitude and said secoind magnitude are less than said final magnitude, said first magnitude being greater than said second magnitude, wherein said detecting means initially only produces said detected oscillation signal after said oscillator clock signal is at least at said first magnitude; and device clock generation means coupled to the detecting means for producing the device clock signal in response to the detected oscillation signal, wherein the device clock generation means produces the device clock signal only after a predetermined time after the detecting means detects said oscillator clock signal being above said first magnitude;

wherein after said predetermined time, said detecting means becomes responsive to said oscillator clock signal being greater than said second magnitude, and wherein said detecting means enables said device clock signal to said on-chip clocking mechanism as long as the magnitude of said oscillator clock signal is at least at said second magnitude.

2. The circuit defined in claim 1 wherein said oscillator has a bias level and said second magnitude comprises said bias level.

3. The circuit defined in claim 1 wherein said second magnitude comprises a magnitude below which the magnitude of said oscillator clock signal does not fall once said oscillator clock signal has surpassed said first level.

4. The circuit defined in claim 1 wherein said detection means is a hysteresis circuit.

5. The circuit defined in claim 1 wherein said device clock generation means includes a counter.

6. The circuit defined in claim 1 wherein said detecting means comprises:

first detection means for detecting when said clock signal is at least at said first amplitude; and second detection means for enabling said device clock signal to said on-chip clocking mechanism and ensuring said magnitude of said oscillator clock signal remains at least at said second magnitude, such that said second detection means enables said device clock signal to said on-chip clocking mechanism while the magnitude of said oscillator clock signal is at least at said second magnitude.

7. A clock interface circuit for driving an output clock signal to a clock generator of an integrated circuit device in response to an oscillator clock signal, said oscillator clock signal having an envelope with a magnitude that varies over a range of magnitudes as the oscillator stabilizes from an initial magnitude to a final magnitude, said circuit comprises:

output clock generation means for generating the output clock signal from the oscillator clock signal in response to an enable signal;

detecting means for sensing said oscillator clock signal, said detecting means capable of detecting said oscillator clock signal at a plurality of magnitudes, wherein said detecting means detects said oscillator clock signal at a first magnitude and a second magnitude, said first magnitude being larger than said second magnitude, said first magnitude comprises a magnitude within said range of said oscillator clock signal and said second magnitude comprises a magnitude below which the magnitude of said oscillator clock signal does not fall once said oscillator clock signal has attained said first magnitude, wherein said detecting means initially only detects said oscillator clock signal when said oscillator clock signal is at least at said first magnitude; and timing means for counting to a predetermined time when said detecting means detects that said oscillator clock signal is at least at said first magnitude, wherein after said predetermined time, said timing means becomes responsive to said oscillator clock signal being only greater than said second magnitude, and wherein said timing means produces said enable signal to enable said output clock signal to said clock generator as long as the magnitude of said oscillator clock signal is at least at said second magnitude.

8. The circuit defined in claim 7 wherein said detecting means is a hysteresis circuit.

9. The circuit defined in claim 7 wherein said timing means is a counter.

10. The circuit defined in claim 9 further comprising means to reset said counter if said magnitude of said oscillator clock signal falls below said first magnitude once said magnitude of said oscillator clock signal has attained said first magnitude but before said timing means counts to said predetermined time.

11. A clock detection circuit for enabling an output clock signal to a clock generator of a device in response to an oscillator clock signal from an oscillator, wherein the oscillator clock signal has a magnitude that ranges from an initial magnitude to a final magnitude as the oscillator stabilizes, said circuit comprising:

circuit means for sensing said oscillator clock signal at a plurality of magnitudes, said circuit means generating a first signal when said oscillator clock signal is at a first magnitude, wherein said first magnitude is between the initial magnitude and the final magnitude; and a counter means for counting to a predetermined time when said circuit means senses the magnitude of said oscillator clock signal to be at said first magnitude, output clock signal generation means coupled to the counter means and the circuit means for generating the output clock signal in response to the oscillator clock signal sensed by the circuit means, wherein said output clock signal generation means only generates the output clock signal after said predetermined time, wherein after said predetermined time, said counter means produces said first signal, such that said output clock signal is enabled to said clock generator, and wherein said circuit means senses the magnitude of said oscillator clock signal at a second magnitude, wherein said second magnitude is less than said first magnitude but greater than said initial magnitude, such that the output clock generation means generates the output clock signal according to the magnitude of the oscillator clock signal sensed at the second magnitude.

12. The circuit defined in claim 11 further comprising means to reset said counter means if said oscillator clock signal falls below said first magnitude once said oscillator clock signal has attained said first magnitude but before said counter means counts to said predetermined time.

13. A clock detection circuit for supplying an output clock signal to a device, said output clock signal being supplied in response to an oscillator clock signal produced by an oscillator, wherein the oscillator clock signal has a magnitude that varies from an initial magnitude to a final magnitude as the oscillator stabilizes, said circuit comprising:
    first buffer means for sensing said oscillator clock signal at a plurality of magnitudes and outputting a first signal when said oscillator clock signal is at least at a first magnitude, wherein said first magnitude is between said initial magnitude and said final magnitude;
    control means coupled to said first buffer means for generating a clock enable signal in response to said first signal after a predetermined time; and
    driver means coupled to said oscillator clock signal and responsive to said clock enable signal, said driver means generating the output clock signal to said device in response to said clock enable signal, and wherein said driver means generates said output clock signal while said clock enable signal is output from said first buffer means, and wherein after said predetermined time said first buffer means senses the oscillator clock signal according to a second magnitude, where said second magnitude is less than the first magnitude, and wherein the first buffer means produces said first signal which causes the control means to output the clock enable signal as long as the oscillator clock signal is at least at the second magnitude.

14. The circuit defined in claim 13 wherein said first buffer means comprises a hysteresis buffer.

15. The circuit defined in claim 13 wherein said driver means comprises an AND gate.

16. The circuit defined in claim 15 wherein said driver means further comprises a buffer mean for receiving said oscillator clock signal and outputting said oscillator clock signal to one of said inputs of said AND gate.

17. The circuit defined in claim 13 wherein said control means terminates generating said output enable signal in response to a powerdown signal.

18. The circuit defined in claim 13 wherein said control means comprises a counter means for counting to said predetermined time in response to said oscillator clock signal being at least at said predetermined magnitude and for outputting said clock enable signal after said predetermined time.

19. The circuit defined in claim 13 wherein said control means comprises:
    counter means coupled to said buffer means for outputting a second signal in response to said first signal after the predetermined time; and
    clock inhibit means for preventing said output clock signal from being enabled until said second signal.

20. A method for generating an output clock signal to a device, wherein the output clock signal is generated in response to an oscillator clock signal from an oscillator, wherein the oscillator clock signal has a magnitude that varies from an initial magnitude to a final magnitude while the oscillator is stabilizing, said method comprising the steps of:
    choosing from among a plurality of magnitudes a first magnitude and a second magnitude for detection of the oscillator clock signal, wherein the first magnitude and the second magnitude are between the initial magnitude and the final magnitude;
    detecting the oscillator clock signal;
    waiting for said oscillator clock signal to reach the first magnitude;
    waiting a predetermined time after said oscillator clock signal has reached said first magnitude; and then
    generating the output clock signal according to the oscillator clock signal; and
    switching to the second magnitude to detect said oscillator clock signal, such that the output clock signal continues to be generated according to the oscillator clock signal being generated at said second magnitude level.

21. The method defined in claim 20 further comprising the step of resetting said predetermined time when said magnitude drops below said first magnitude, such that when said magnitude rises above said first magnitude thereafter then said step of switching does not occur until said magnitude remains above said first level for an uninterrupted predetermined time.

22. A clock generation circuit for generating an operating clock signal for an integrated circuit device:
    an oscillator for generating an oscillator clock signal, wherein the oscillator clock signal has a magnitude and said magnitude varies from an initial magnitude to a final magnitude while the oscillator is stabilizing;
    clock generator means coupled to the oscillator for generating the operating clock signal in response to the oscillator clock signal and an enable signal;
    first detection means for sensing the oscillator clock signal at a plurality of magnitudes, wherein the first detection means generates a first signal in response to sensing the magnitude of the oscillator clock signal being at a first magnitude, wherein the first magnitude is between the initial magnitude and the final magnitude;
    timing means coupled to the first detection means for generating the enable signal after a predetermined time after the first detection means sense the oscillator clock signal being at the first magnitude, such that the clock generator means produces the operating clock signal after the predetermined time according to the magnitude of the oscillator signal as sensed by the first detection means;
    and wherein after predetermined time, the first detection means senses the oscillator clock signal at a second magnitude lower than the first magnitude.

23. A clock detection circuit for supplying an output clock signal to a device, said output clock signal being supplied in response to an oscillator clock signal produced by an oscillator, wherein the oscillator clock signal has a magnitude that varies from an initial magnitude to a final magnitude as the oscillator stabilizes, said circuit comprising:
    first buffer means including a hysteresis buffer for sensing said oscillator clock signal at a plurality of magnitudes and outputting a first signal when said oscillator clock signal is at least at a first magnitude, wherein said first magnitude is between said initial magnitude and said final magnitude;
    control means coupled to said first buffer means for generating a clock enable signal in response to said first signal after a predetermined time; and
    driver means couple to said oscillator clock signal and responsive to said clock enable signal, said driver means generating the output clock signal to said device in response to said clock enable signal, and wherein said driver means generates said output clock signal while said clock enable signal is output from said first buffer means, and wherein after said predetermined time said first buffer means senses the oscillator clock signal according to a second magnitude, where said second magnitude is less than the first magnitude, and wherein the first buffer means produces said first signal which causes the control means to output the clock enable signal as long as the oscillator clock signal is at least at the second magnitude.

24. The circuit defined in claim 23 wherein said driver means includes an AND gate.

25. The circuit defined in claim 24 wherein said driver means further includes a buffer means for receiving said oscillator clock signal and outputting said oscillator clock signal to one of said inputs of said AND gate.

26. The circuit defined in claim 23 wherein said control means terminates generates said output enable signal in response to a powerdown signal.

27. The circuit defined in claim 23 wherein said control means includes a counter means for counting to said predetermined time in response to said oscillator clock signal being at least at said predetermined magnitude and for outputting said clock enable signal after said predetermined time.

28. The circuit defined in claim 23 wherein said control means comprises:
  counter means coupled to said first buffer means for outputting a second signal in response to said first signal after the predetermined time; and
  clock inhibit means for preventing said output clock signal from being enabled until said second signal.

* * * * *